(12) United States Patent
Maeda

(10) Patent No.: US 11,245,057 B2
(45) Date of Patent: Feb. 8, 2022

(54) METHOD FOR ATTACHING LIGHT TRANSMISSIVE MEMBER TO LIGHT EMITTING ELEMENT

(71) Applicant: NICHIA CORPORATION, Anan (JP)

(72) Inventor: Rie Maeda, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/878,241

(22) Filed: May 19, 2020

(65) Prior Publication Data

US 2020/0279981 A1 Sep. 3, 2020

Related U.S. Application Data

(62) Division of application No. 16/037,763, filed on Jul. 17, 2018, now Pat. No. 10,693,045.

(30) Foreign Application Priority Data

Jul. 28, 2017 (JP) .............................. JP2017-146627

(51) Int. Cl.
*H01L 33/50* (2010.01)
*H01L 33/54* (2010.01)
(Continued)

(52) U.S. Cl.
CPC ........ *H01L 33/505* (2013.01); *H01L 33/0095* (2013.01); *H01L 33/502* (2013.01);
(Continued)

(58) Field of Classification Search
CPC ................ H01L 2933/0041; H01L 2933/0058
See application file for complete search history.

(56) References Cited

U.S. PATENT DOCUMENTS 9,922,963 B2 3/2018 Hung et al.
10,217,913 B2 * 2/2019 Pindl ..................... H01L 33/502
(Continued)

FOREIGN PATENT DOCUMENTS

JP 2003-110153 A 4/2003
JP 2012-004303 A 1/2012
(Continued)

OTHER PUBLICATIONS

Non Final Office Action of the US continuation U.S. Appl. No. 16/037,763, dated Nov. 18, 2019.
(Continued)

*Primary Examiner* — Daniel Luke
(74) *Attorney, Agent, or Firm* — Global IP Counselors, LLP

(57) ABSTRACT

The method of manufacturing a light emitting device includes: providing a light-transmissive member; providing light emitting elements each having a primary light emission surface and an electrode formation surface; bonding the light emitting elements to a base member such that the electrode formation surfaces face an upper surface of the base member; disposing a generally flat layer of a light-transmissive bonding member on an upper surface of the light-transmissive member; disposing the light emitting elements on the light-transmissive member such that the primary light emission surfaces face the upper surface of the light-transmissive member via the bonding member; disposing a part of the bonding member on a lateral surface of each of the light emitting elements; removing a part of the light-transmissive member to form a groove between the light emitting elements; forming a light-reflective member at least in the groove; and cutting the light-reflective member.

19 Claims, 7 Drawing Sheets

(51) Int. Cl.
  *H01L 33/60* (2010.01)
  *H01L 33/62* (2010.01)
  *H01L 33/00* (2010.01)
  *H01L 25/075* (2006.01)

(52) U.S. Cl.
  CPC .............. *H01L 33/54* (2013.01); *H01L 33/62* (2013.01); *H01L 25/0753* (2013.01); *H01L 33/60* (2013.01); *H01L 2933/005* (2013.01); *H01L 2933/0025* (2013.01); *H01L 2933/0033* (2013.01); *H01L 2933/0041* (2013.01); *H01L 2933/0058* (2013.01); *H01L 2933/0066* (2013.01); *H01L 2933/0091* (2013.01)

(56) References Cited

U.S. PATENT DOCUMENTS

| | | |
|---|---|---|
| 2002/0185965 A1 | 12/2002 | Collins, III et al. |
| 2012/0140506 A1 | 6/2012 | Waragawa et al. |
| 2013/0015483 A1 | 1/2013 | Shimokawa et al. |
| 2014/0127464 A1 | 5/2014 | Eberhardt et al. |
| 2014/0131753 A1 | 5/2014 | Ishida et al. |
| 2015/0204494 A1 | 7/2015 | Wada et al. |
| 2016/0141468 A1* | 5/2016 | Li ................ B29C 39/025 |
| | | 362/351 |
| 2016/0240735 A1 | 8/2016 | Moran et al. |
| 2016/0276543 A1* | 9/2016 | Hung ............... H01L 29/866 |
| 2017/0033267 A1 | 2/2017 | Tamaki et al. |
| 2017/0084587 A1 | 3/2017 | Hung et al. |

FOREIGN PATENT DOCUMENTS

| | | | |
|---|---|---|---|
| JP | 2013-012545 A | | 1/2013 |
| JP | 2013-021175 A | | 1/2013 |
| JP | 2014-110333 A | * | 6/2014 |
| JP | 2014-110333 A | | 6/2014 |
| JP | 2014-120722 A | | 6/2014 |
| JP | 2014-207349 A | | 10/2014 |
| JP | 2015-023162 A | | 2/2015 |
| JP | 2015-138839 A | | 7/2015 |
| JP | 2016-225596 A | | 12/2016 |
| JP | 2017-033967 A | | 2/2017 |

OTHER PUBLICATIONS

Notice of Allowance of the US continuation U.S. Appl. No. 16/037,763, dated Feb. 24, 2020.

* cited by examiner

METHOD FOR ATTACHING LIGHT TRANSMISSIVE MEMBER TO LIGHT EMITTING ELEMENT

CROSS-REFERENCE TO RELATED APPLICATION

This application is a divisional application of U.S. patent application Ser. No. 16/037,763 filed on Jul. 17, 2018. This application claims priority to Japanese Patent Application No. 2017-146627, filed on Jul. 28, 2017. The entire disclosures of U.S. patent application Ser. No. 16/037,763 and Japanese Patent Application No. 2017-146627 are hereby incorporated by reference.

BACKGROUND

The present disclosure relates to a method of manufacturing a light emitting device.

A light emitting device in which a light emitting element is mounted has been used for a backlight of a liquid crystal display device, or the like. In such a light emitting device, a light-transmissive member containing a fluorescent material is bonded onto a light emitting element by a light-transmissive bonding member. It has been suggested to employ a bonding member having a circular-arc shape at a lateral surface of a light emitting element for improving light extraction efficiency on a lateral side of such a light emitting device (Japanese Unexamined Patent Publication 2013-12545).

SUMMARY

An object of the present disclosure is to provide a method of manufacturing a light emitting device, in which a light-transmissive member can be efficiently disposed on a light emitting element more easily at an appropriate position and in an appropriate shape.

A method of manufacturing a light emitting device according to the present disclosure includes: providing a light-transmissive member having a plate-like shape; providing a plurality of light emitting elements each having a primary light emission surface and an electrode formation surface on a side opposite to the primary light emission surface; bonding the light emitting elements to an upper surface of a base member such that the electrode formation surface of each of the light emitting elements faces the upper surface of the base member; disposing a generally flat layer of a light-transmissive bonding member on an upper surface of the light-transmissive member; disposing the light emitting elements on the upper surface of the light-transmissive member such that the primary light emission surface of each of the light emitting elements faces the upper surface of the light-transmissive member via the bonding member interposed therebetween; disposing a part of the bonding member on a lateral surface of each of the light emitting elements; removing a part of the light-transmissive member to form a groove between the light emitting elements; forming a light-reflective member at least in the groove; and cutting the light-reflective member and the base member.

According to the present disclosure, it is possible to provide a method of manufacturing a light emitting device, in which a light-transmissive member can be efficiently disposed on a light emitting element more easily at an appropriate position and in an appropriate shape.

DETAILED DESCRIPTION OF EMBODIMENTS

Light emitting devices described below are intended to embody the technical concept of the present disclosure, and the present disclosure is not limited to or by what follows unless otherwise specified. Details described in one embodiment or example are also applicable to other embodiments and examples. Sizes, aspect ratios, positional relations and so on of members shown in the drawings may be exaggerated or omitted for clarifying or simplifying explanation.

First Embodiment

Figure 1A:
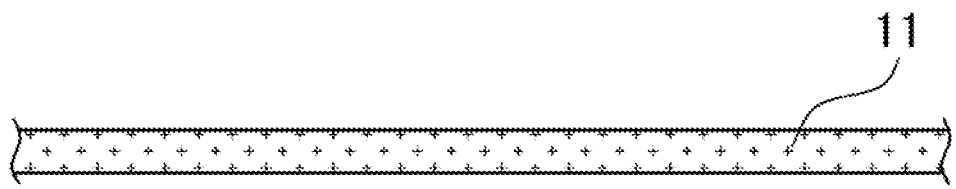
FIG. 1A is a schematic sectional diagram showing a process of a first embodiment of a method of manufacturing a light emitting device.
Figure 1B:
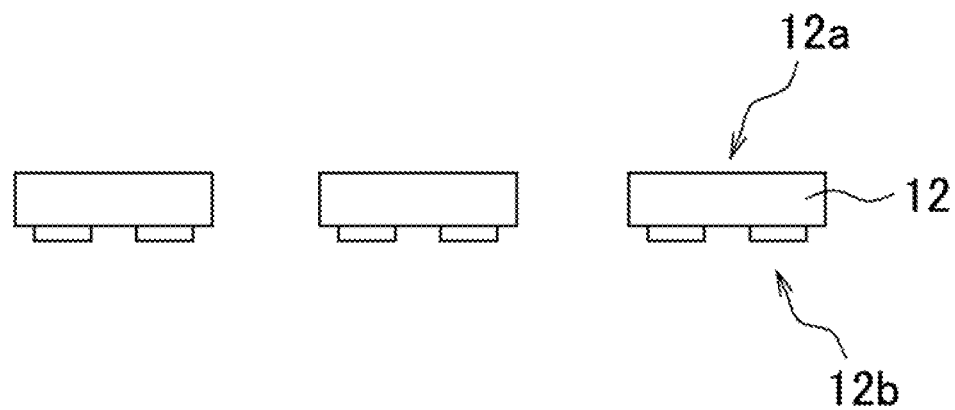
FIG. 1B is a schematic sectional diagram showing a process of the first embodiment of a method of manufacturing a light emitting device.
Figure 1C:
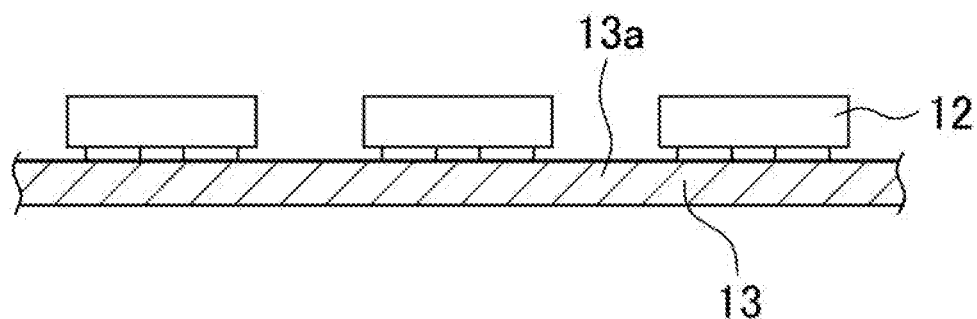
FIG. 1C is a schematic sectional diagram showing a process of the first embodiment of a method of manufacturing a light emitting device.
Figure 1D:
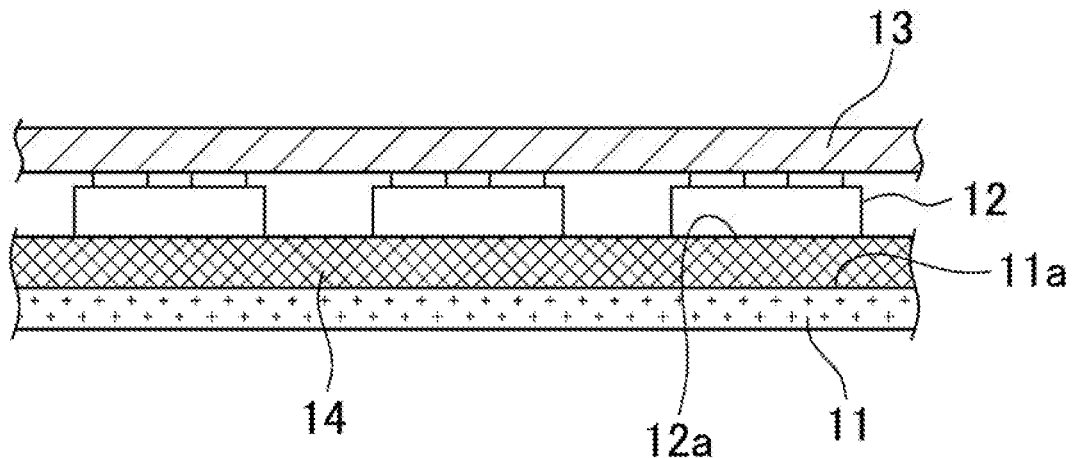
FIG. 1D is a schematic sectional diagram showing a process of the first embodiment of a method of manufacturing a light emitting device.
Figure 1E:
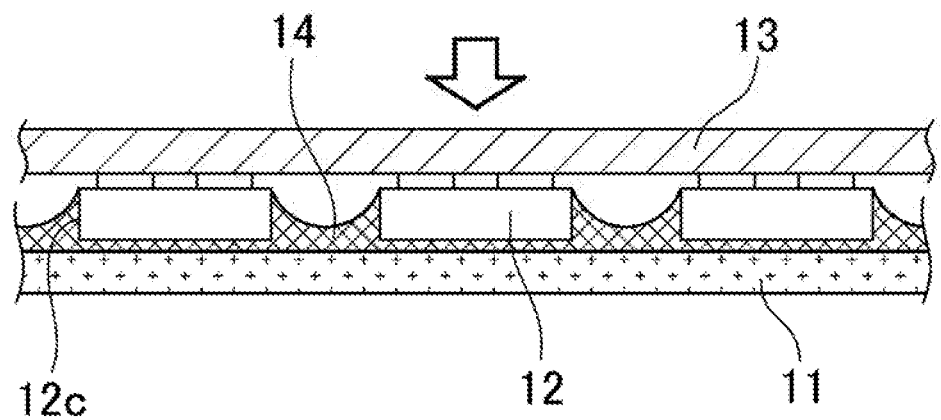
FIG. 1E is a schematic sectional diagram showing a process of the first embodiment of a method of manufacturing a light emitting device.
Figure 1F:
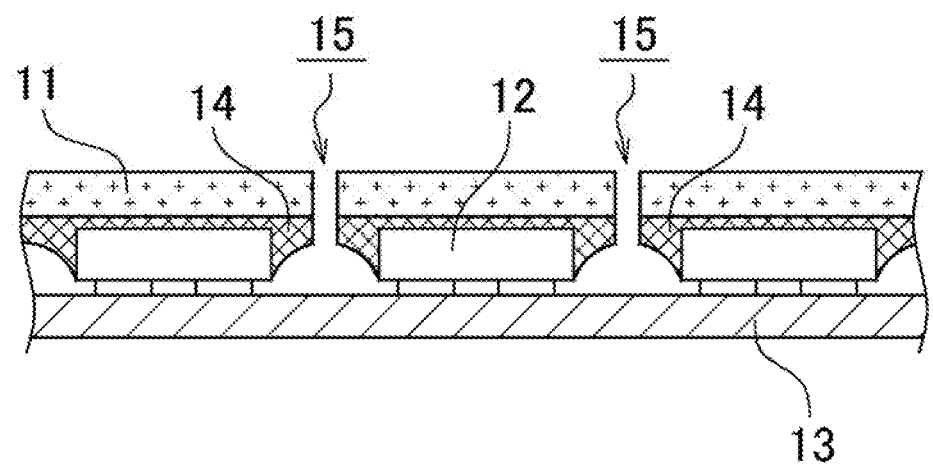
FIG. 1F is a schematic sectional diagram showing a process of the first embodiment of a method of manufacturing a light emitting device.
Figure 1G:
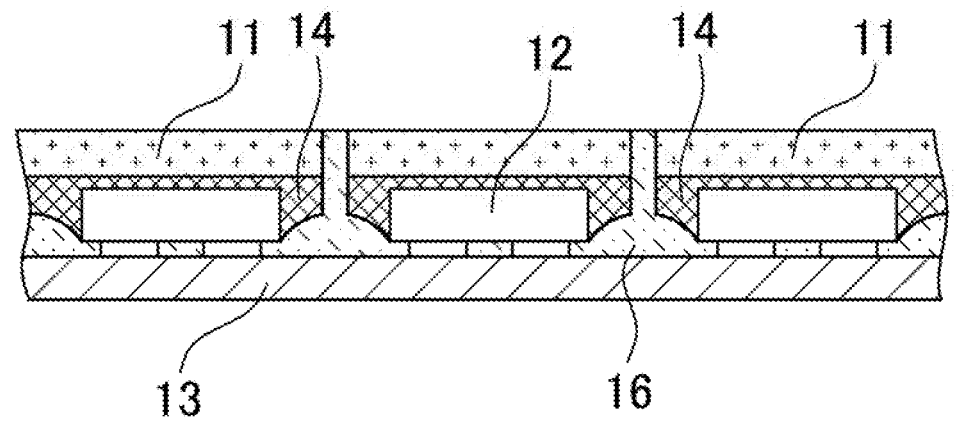
FIG. 1G is a schematic sectional diagram showing a process of the first embodiment of a method of manufacturing a light emitting device.
Figure 1H:
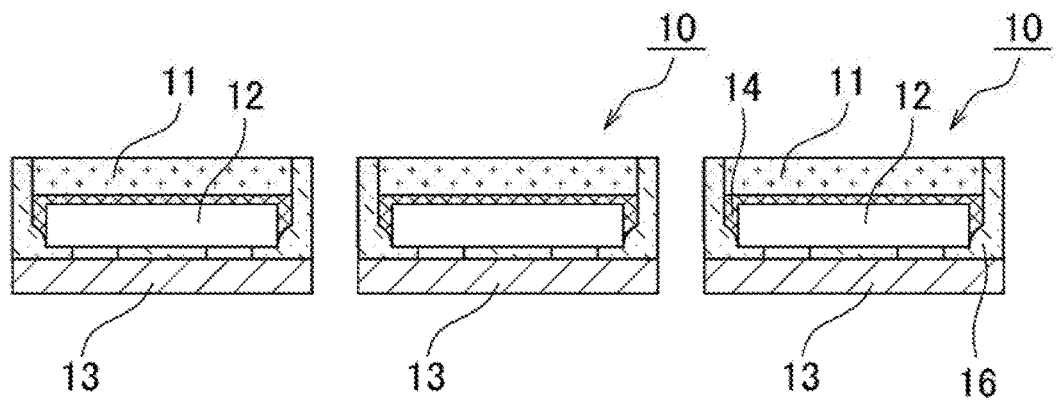
FIG. 1H is a schematic sectional diagram showing a process of the first embodiment of a method of manufacturing a light emitting device.
Figure 1I:
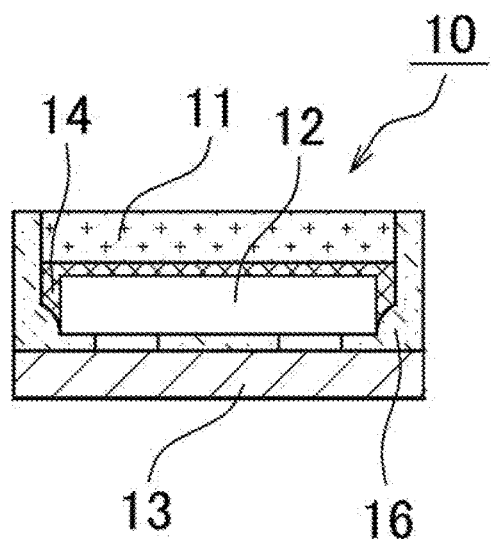
FIG. 1I is a schematic sectional view of a light emitting device obtained by the method of manufacturing a light emitting device according to the first embodiment.

A method of manufacturing a light emitting device according to this embodiment includes: providing a light-transmissive member having a plate-like shape (FIG. 1A); providing a plurality of light emitting elements each having a primary light emission surface and an electrode formation surface on a side opposite to the primary light emission surface (FIG. 1B); bonding the light emitting elements to an upper surface of a base member such that the electrode formation surfaces face the upper surface of the base member (FIG. 1C); disposing the light emitting elements on an upper surface of the light-transmissive member such that the primary light emission surface of each of the light emitting elements faces the upper surface of the light-transmissive member via a light-transmissive bonding member interposed therebetween (FIG. 1D); disposing a part of the bonding member on a lateral surface of the light emitting element (FIG. 1E); removing a part of the light-transmissive member to form a groove between the light emitting elements (FIG. 1F); forming a light-reflective member in at least the groove (FIG. 1G); and cutting the light-reflective member and the base member (FIG. 1I-1).

In this embodiment, a plurality of light emitting elements are bonded to a light-transmissive member having a plate-like shape, the light-reflective members are integrally formed, and the light-reflective members and a base member are cut as described above. Accordingly, a light-transmissive member can be efficiently disposed on a light emitting element and on the periphery thereof at an appropriate position and in an appropriate shape.

Providing Light-Transmissive Member 11

As shown in FIG. 1A, the light-transmissive member 11 is obtained. The light-transmissive member 11 may have a plate-like shape such as a sheet shape or a film shape. The light-transmissive member 11 may have such a size that a plurality of light emitting elements 12 can be covered, in other words, a size larger than the total plane area of the primary light emission surfaces 12a of a plurality of light emitting elements 12. The light-transmissive member 11 has a size of, for example, 20 cm×10 cm, 3 cm×3 cm or 9 cm×6 cm. The surface of the light-transmissive member 11 may be flat, or may have irregularities.

The light-transmissive member 11 may be one that can transmit light emitted from the light emitting element 12, and is preferably one that transmits, for example, at least 60%, at least 70%, or at least 80% of the light.

The light-transmissive member 11 can be formed from a light-transmissive resin, glass, crystal or a sintered body of a fluorescent material, or the like. The light-transmissive member 11 may be one including a light-transmissive member such as a light-transmissive resin or glass which contains a fluorescent material.

Examples of the light-transmissive resin include silicone resins, silicone modified resins, epoxy resins, phenol resins, polycarbonate resins, acryl resins, TPX resins, polynorbornene resins, and hybrid resins including at least one of these resins. Among these examples, silicone resins and epoxy resins are preferable, and particularly, silicone resins is preferable due to its good light resistance and heat resistance.

Examples of the fluorescent material include those that are known in the art. Examples thereof include yttrium-aluminum-garnet (YAG)-based fluorescent materials activated by cerium, lutetium-aluminum-garnet (LAG)-based fluorescent materials activated by cerium, nitrogen-containing calcium aluminosilicate ($CaO-Al_2O_3 \cdot SiO_2$)-based fluorescent materials activated by europium and/or chromium, silicate (($Sr, Ba)_2SiO_4$)-based fluorescent materials activated by europium, @-sialon fluorescent materials, KSF-based fluorescent materials ($K_2SiF_6$:Mn), and fine particles of a semiconductor called a quantum dot fluorescent material or the like. Accordingly, a light emitting device that emits mixed-color light (e.g. white system) of primary light and secondary light having a visible wavelength, or a light emitting device that is excited by primary light of ultraviolet light to emit secondary light having a visible wavelength can be obtained. When the light emitting device is used for a backlight of a liquid crystal display, or the like, it is preferable to use a fluorescent material that is excited by blue light emitted from the light emitting element 12 and emits red light (e.g. KSF-based fluorescent material), and a fluorescent material that is excited by blue light emitted from the light emitting element 12 and emits green light (e.g. ß-sialon fluorescent material). Accordingly, the color reproduction range of a display incorporating a light emitting device can be widened.

The shape of the fluorescent material may be of any of granular type, spherical type, hollow type, porous type and so on.

When the light-transmissive member contains the fluorescent material, the average particle size (i.e., median diameter) of the fluorescent material is, for example, about 0.08 μm to 10 μm. Preferably, the fluorescent material is contained in an amount of 10% to 60% by weight based on the weight of the light-transmissive member 11.

When an inorganic material such as glass or a fluorescent material sintered body is used as the light-transmissive member 11, the light-transmissive member is less likely to degraded, thereby realizing high reliable light emitting device. Such a light emitting device can be used as, for example, a light source for a headlight of a vehicle.

The light-transmissive member 11 may further contain a filler (e.g. diffusing agent, colorant or the like). Examples thereof include silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass and carbon black. Among these examples, titanium oxide is preferable because it relatively stable to moisture etc., has a high refractive index, and is good in thermal conductivity. When the light-transmissive member is configured with a material containing a liquid resin and a particulate fluorescent material, it is preferable to mix silica fine particles with the light-transmissive member. Accordingly, thixotropy is imparted to a material of the light-transmissive member to reduce sedimentation of the fluorescent material, and thus it is possible to obtain a light-transmissive member in which a fluorescent material is uniformly dispersed. The shape of the particle of the filler may be of any of granular type, spherical type, hollow type, porous type and so on. The average particle size (i.e. median diameter) is preferably about 0.08 μm to 10 μm. Accordingly, a light scattering effect can be obtained with high efficiency. Preferably, the filler is contained in an amount of 10% to 60% by weight in an amount of, for example, 10% to 60% by weight based on the weight of the light-transmissive member. For example, if a layer containing a filler is provided on the light extraction surface side of the light-transmissive member, improvement of color non-uniformity and reduction of stickiness of the light emitting device can be expected. When the light-transmissive member is formed using a resin, use of a filler having a high thermal conductivity can improve thermal conductivity to enhance the reliability of the light emitting device.

The light-transmissive member 11 may have a single layer, or have a layered structure with a plurality of layers as described later.

The thickness of the light-transmissive member 11 affects the height of the light-emitting device. When the thickness of the light-transmissive member 11 decreases, the risk of breakage is increased, and the amount of a fluorescent material that can be contained is limited. Therefore, the thickness of the light-transmissive member 11 is, for example, 10 µm to 300 µm, preferably 30 µm to 200 µm.

The light-transmissive member 11 may be formed using a material in which a liquid resin and, as necessary, a fluorescent material, by, for example, compression molding, transfer molding, injection molding, spraying, printing, potting or the like. Alternatively, a fluorescent material formed in a substantially uniform thickness by electrophoretic deposition or the like can be impregnated with a resin to form the light-transmissive member 11.

Providing Light Emitting Element 12

As shown in FIG. 1B, the light emitting element 12 has the primary light emission surface 12a, and an electrode formation surface 12b with an electrode disposed on a side opposite to the primary light emission surface 12a.

The size, shape, emission wavelength and the like of the light emitting element 12 can be appropriately selected. The sizes, shapes, emission wavelengths and the like of a plurality of light emitting elements 12 may be different from each other, but are preferably the same.

In the light emitting element 12, a first semiconductor layer (e.g. n-type semiconductor layer), a light emitting layer, and a second semiconductor layer (e.g. p-type semiconductor layer) are stacked in this order as a semiconductor layered body, and both a first electrode electrically connected to the first semiconductor layer and a second electrode electrically connected to the second semiconductor layer are provided on the same surface side (e.g. second semiconductor layer-side surface). Accordingly, flip-chip mounting can be performed in which the light emitting element is bonded oppositely to the base member 13. The semiconductor layered body is normally stacked on a growth substrate, and the light emitting element 12 may include a growth substrate, or may include no growth substrate. The types and materials of the first semiconductor layer, the light emitting layer, and the second semiconductor layer are not particularly limited, and examples thereof include various semiconductors such as Group III-V compound semiconductors and Group II-VI compound semiconductors. Specific examples thereof include nitride-based semiconductor materials such as $In_XAl_YGa_{1-X-Y}N$ ($0 \leq X$, $0 \leq Y$, $X+Y \leq 1$). Each of the thickness and the layer structure of each layer can be set to one that is known in the art.

The shape of the semiconductor layered body in plan view is preferably a quadrangle or a shape similar to a quadrangle, but is not particularly limited. The size of the semiconductor layered body in plan view can be appropriately adjusted in accordance with the size of the light emitting element 12 in plan view. For example, the semiconductor layered body, that is, the length of the light emitting element 12 has a length of 200 µm to 1500 µm in a longitudinal direction, a length of 50 µm to 400 µm in a width direction, and a thickness of the 80 µm to 200 µm.

The first electrode and the second electrode can be formed from, for example, a single-layer film or layered film of metals such as Au, Pt, Pd, Rh, Ni, W, Mo, Cr and Ti, or alloys thereof. Specifically, mention is made of layered films such as those of Ti/Rh/Au, W/Pt/Au, Rh/Pt/Au, W/Pt/Au, Ni/Pt/Au and Ti/Rh, in order from the semiconductor layer side. As the thickness of the film, a thickness of any of films that are used in the art may be employed. Preferably, a material layer, of which reflectivity to light emitted from the light emitting layer is higher than that of each of other materials of the electrode, is disposed on each of a side close to the first semiconductor layer and a side close to the second semiconductor layer. Examples of the material having a high reflectivity include layers containing silver, a silver alloy or aluminum. When silver or a silver alloy is used, it is preferable to form a covering layer that covers the surface (i.e., upper surface and end surface) of the layer for mitigating migration of silver. Normally, such a covering layer may be one formed of a metal or alloy that is used as an electrically conductive material, and the covering layer is, for example, a single layer or stacked layer containing a metal such as aluminum, copper or nickel.

In the light emitting element 12, a DBR (i.e., distributed Bragg reflector) layer or the like may be disposed on electrode formation surface side of the semiconductor layered body to the extent not hindering electrical connection. For example, the DBR has a multilayer structure in which a low-refractive-index layer and a high-refractive-index layer are stacked on a base layer composed an oxidized film or the like, as appropriate, and the DBR reflects selectively reflects light having a predetermined wavelength. Specifically, films having various refractive indices and thicknesses which are to reflect a quarter of wavelength, are alternately layered, thereby enabling reflection at the predetermined wavelength in a highly efficient manner. The DBR can be formed using as a material an oxide or nitride of at least one selected from the group consisting of Si, Ti, Zr, Nb, Ta and Al.

Bonding Light Emitting Element 12

As shown in FIG. 1C, a plurality of light emitting elements 12 is bonded to the upper surface of the base member 13 so as to face the electrode formation surfaces 12b to the upper surface of the base member 13. Preferably, a plurality of light emitting elements 12 is regularly arranged, and a plurality of light emitting elements 12 is provided at substantially equal intervals. Accordingly, cutting as described later can be easily controlled.

For example, the interval between light emitting elements 12 may be 10 µm to 1000 µm, and is preferably, for example, 200 µm to 800 µm. Accordingly, the material costs of the later-described light-transmissive bonding member 14 and/or light-reflective member 16, etc. can be reduced.

The base member 13 used here may be a base member to be used only for arranging light emitting elements 12 at equal intervals, or a mounting substrate with positive and negative terminals disposed on a surface thereof. In the former case, the base member may be removed, for example after a light emitting device is manufactured by a series of steps. In the latter case, it is preferable to connect the electrodes of the light emitting element 12 to positive and negative terminals, respectively, by an electrically conductive bonding member.

The base member 13 is, for example, one formed using a resin film, a metal plate, a ceramic plate or the like alone, or a composite thereof. The base member 13 may be rigid, or may have flexibility.

Arranging Light Emitting Elements 12 and Bonding Member 14 on Light-Transmissive Member 11

As shown in FIG. 1D, a plurality of light emitting elements 12 is disposed on the upper surface of the light-transmissive member 11 such that the primary light emission surfaces 12a of a plurality of light emitting elements 12 face the upper surface of the light-transmissive member 11 with the light-transmissive bonding member 14 interposed therebetween.

The light-transmissive bonding member 14 to be used for bonding the light emitting elements 12 to the light-transmissive member 11 is preferably one that transmits 60% or more of light emitted from the light emitting element. The bonding member 14 is preferably a liquid material capable of being cured by light, heat or the like. In particular, a thermosetting resin such as a silicone resin, a silicone modified resin, an epoxy resin or a phenol resin is preferably used as the bonding member 14. The bonding member 14 may contain an additive that scatters light. Accordingly, light emitted from the light emitting element can be made uniform in the bonding member 14.

Figure 2:
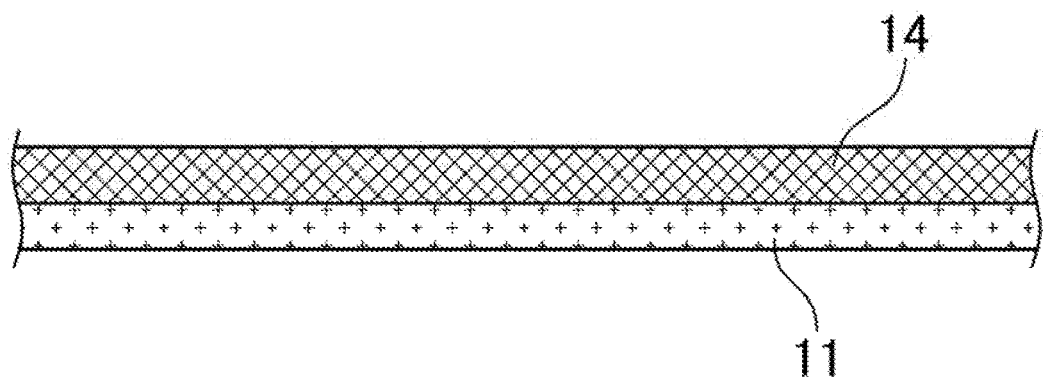
FIG. 2 is a schematic sectional diagram showing one example of a method of disposing a bonding member on a light-transmissive member.

For example, as shown in FIG. 2, the light-transmissive bonding member 14 can be used with the bonding member 14 disposed on the upper surface of the light-transmissive member 11 in providing the plate-like shaped light-transmissive member 11. As described later, the bonding member 14 may be disposed on the primary light emission surfaces 12a of the light emitting elements 12 beforehand.

The amount of the bonding member 14 is required to be sufficient for bonding the light emitting elements 12 to the light-transmissive member 11, and is preferably such that a part or the whole of the lateral surfaces 12c of the light emitting elements 12 can be covered. Further, the amount of the bonding member 14 is more preferably such that the whole of the lateral surfaces 12c of the light emitting elements 12 can be covered.

In particular, it is preferable that the bonding member 14 is disposed in such a sufficient amount that the bonding member 14 exists continuously among adjacent ones of the light emitting elements 12 as shown in FIG. 1E, in other words, the lateral surface of one of the light emitting elements 12 is connected to the lateral surface of adjacent one of the light emitting elements 12 by the bonding member 14. Accordingly, light emitted from a plurality of light emitting elements 12 can be made uniform in the bonding member 14, so that light emitted from the light emitting device is less likely to be non-uniform.

To continuously dispose the bonding member 14 among a plurality of adjacent light emitting elements 12, for example, it is preferable to apply a pressure in a direction indicated by the arrow in FIG. 1E, or apply a pressure from the light-transmissive member side. The pressure here is, for example, 1.0 Kg to 2.5 Kg. Further, it is more preferable to apply heat, light or the like to the bonding member 14 in order to cure the bonding member 14 after application of a pressure. Accordingly, the light emitting elements 12 and the light-transmissive member 11 can be fixed firmly at an appropriate position. The temperature of heat applied in this fixation is preferably at 300° C. at most, and more preferably at in a range of from 150° C. to 200° C.

Preferably, the bonding member 14 is disposed in such a manner that a thickness (as measured along a direction parallel to the lateral surface 12c) of a portion in which the bonding member 14 is in contact with the lateral surface 12c of the light emitting elements 12 between light emitting elements 12 is greater than a thickness of a portion in which the bonding member 14 is away from the lateral surface 12c of the light emitting element 12 as shown in, for example, FIG. 1E. In other words, the bonding member 14 is preferably disposed in such a manner that the outer surface of the bonding member 14 forms a recess inwardly curved toward the light-transmissive member 11 side between light emitting elements 12. At the time of cutting light emitting elements 12 from each other, the outer surface of the bonding member 14 disposed on the lateral surface 12c of the light emitting element 12 can be inclined so as to extend toward the cut surface. Accordingly, light emitted from the lateral surface 12c of the light emitting element 12 can be more efficiently extracted to the light-transmissive member 11.

Preferably, the bonding member 14 covers the lateral surface of the light emitting element 12 as large area as possible. The bonding member covers at least 50%, preferably at least 70%, more preferably at least 90% of the lateral surface of the light emitting element 12. Accordingly, light emitted from the lateral surface 12c of the light emitting element 12 can be more efficiently extracted to the light-transmissive member 11.

Forming Groove 15

As shown in FIG. 1F, a part of the light-transmissive member 11 is removed to form the groove 15 between light emitting elements 12. For example, the width of the groove 15 formed by removing the light-transmissive member 11 is preferably smaller than a distance between light emitting elements 12, more preferably a such a width that the light-transmissive member 11 having a width of 100 µm or more from the lateral surface 12c of the light emitting element 12 remains. Specifically, the width of the groove 15 is 5 µm to 10 µm. The width of the groove 15 is preferably constant in the depth direction, but may gradually or sharply increase or decrease in the depth direction.

The groove 15 is preferably formed with such a depth that the whole of the light-transmissive member 11 is removed in the thickness direction, and it is more preferable that the whole of the light-transmissive bonding member 14 is removed in the thickness direction to form an opening that passes through the light-transmissive member 11 and the bonding member 14 as shown in FIG. 1F. It is preferable that the groove 15 is formed at a central part between light emitting elements 12, and therefore it is more preferable that a portion of the light-transmissive bonding member 14, which has the smallest thickness, is removed in the total thickness. Specifically, the depth of the groove 15 is in a range of from 150 µm to 210 µm.

When such a groove 15 is formed, the later-described light-reflective member 16 can be easily formed on the periphery of the light emitting element 12 and between the light emitting element 12 and the base member 13. Further, by adjusting the width of the groove 15, the thickness of the light-transmissive bonding member 14 that covers the lateral surface 12c of the light emitting element 12 can be appropriately set, so that light emitted from the light emitting element 12 can be made uniform in the bonding member 14, or reflection or scattering of light can be controlled.

The groove 15 can be formed by partial polishing or grinding, cutting, processing by Thomson blade, ultrasonic processing, laser processing, dicing using a blade having a V-shaped edge, or the like.

Forming Light-Reflective Member 16

As shown in FIG. 1G, the light-reflective member 16 is formed at least in the groove 15. The light-reflective member 16 is preferably formed so as to cover the whole inner wall of the groove 15, and more preferably, the light-reflective member 16 is formed so as to cover a part or the whole of the periphery of the light emitting element 12 and a gap between the light emitting element 12 and the base member 13. Accordingly, light emitted from the primary light emission surface 12a of the light emitting element 12 can be efficiently extracted from the upper side of the light-transmissive member 14 through the inside of the light-transmissive member. By filling the whole of the inside of the groove 15 with the light-reflective member 16, the lateral surface of the light-transmissive member 11 is covered with the light-reflective member 16. Accordingly, it is possible to obtain a light emitting device having a high contrast between a light emitting region and a non-light-emitting region, and distinguishability therebetween.

Preferably, the light-reflective member 16 is formed using a material capable of reflecting light emitted from the light emitting element 12. Specifically, the light-reflective member 16 can be formed by adding a light-reflective substance in a resin material same as or similar to the above-described light-transmissive resin. Examples of the light-reflective substance include titanium oxide, silicon oxide, zirconium oxide, magnesium oxide, yttrium oxide, yttria-stabilized zirconia, calcium carbonate, calcium hydroxide, calcium silicate, zinc oxide, barium titanate, potassium titanate, alumina, aluminum nitride, boron nitride and mullite. In particular, titanium oxide is preferable because it is relatively stable to moisture etc., and has a high refractive index.

The light-reflective member 16 can be formed by molding such as compression molding, transfer molding or injection molding, printing, potting or the like. In particular, compression molding or transfer molding is preferable because it is more easily carried out.

Preferably, the light-reflective member 16 is formed so as to be flush with the upper surface of the light-transmissive member 11 bonded to the primary light emission surface 12a of each of the light emitting elements 12. Accordingly, it is possible to produce a light emitting device that is thin, and has distinguishability between a light emitting region and a non-light-emitting region.

Cutting

As shown in FIG. 1H, the light-reflective member 16 and the base member 13 are cut. Accordingly, a plurality of light emitting devices can be obtained. Cutting may be performed every one light emitting element, or may be performed every two or more light emitting elements 12 12 between light emitting elements 12. In the latter case, a light emitting device including a plurality of light emitting elements 12 can be obtained.

Cutting can be performed by a method such as dicing, processing by Thomson blade, ultrasonic processing or laser processing.

Cutting may be performed between adjacent light-transmissive members 11 so as to remove the light-reflective member corresponding to a gap between the adjacent light-transmissive members 11. Preferably, cutting is performed between adjacent light-transmissive members 11 by removing the light-reflective member with a width smaller than a gap between light-transmissive members 11 so that the light-reflective member covers the lateral surfaces of the light-transmissive member 11. Accordingly, emission of light from the lateral surface of the light-transmissive member 11 can be prevented to obtain a light emitting device having parting property.

The base member 13 may be removed after forming the light-reflective member 16 or after cutting. When the base member 13 is removed after forming the light-reflective member 16, only the light-reflective member 16 may be cut.

Light Emitting Device

In the light emitting device produced by the above-described manufacturing method, the lateral surfaces of the light-transmissive member and the outer surfaces of the bonding member are covered with the light-reflective member as shown in FIG. 1I. The outer surface of the bonding member is inclined so as to extend toward the light-transmissive member. Accordingly, light emitted from the lateral surface 12c of the light emitting element 12 can be efficiently extracted to the light-transmissive member 11, and it is possible to obtain a light emitting device having a high contrast between a light emitting region and a non-light-emitting region, and distinguishability therebetween. Further, a part of the bonding member between light emitting elements, and the whole of the bonding member in the thickness direction are removed during formation of the groove, thus the lateral surface of the light-transmissive member is flush with a part of the outer surface of the bonding member. Accordingly, a light emitting device having a small size can be obtained.

Modification

In the step of forming the groove 15, a position at which the groove 15 is formed may be selected as necessary. The groove 15 may be formed between each one of the light emitting elements 12 as shown in, for example, FIG. 1F, or may be formed every other light emitting element 12, or may be formed every two or more light emitting elements 12.

Figure 6A:
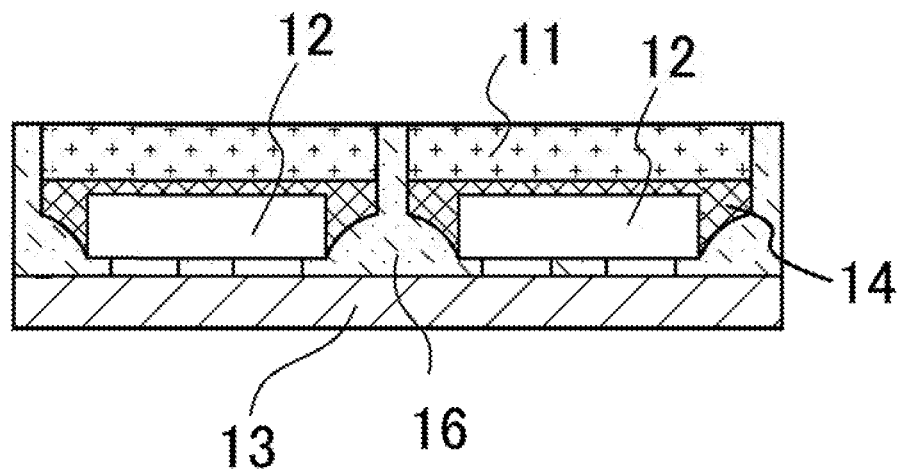
FIG. 6A is a schematic sectional diagram showing a modification of the first embodiment of a method of manufacturing a light emitting device.

When the groove 15 is formed between light emitting elements 12, and cutting is performed every two or more light emitting elements 12, it is possible to obtain a light emitting device, in which a plurality of light emitting elements 12 are included, having distinguishability between light emitting elements 12 as shown in FIG. 6A. Accordingly, it is possible to obtain a light emitting device having a high contrast between a light emitting region and a non-light-emitting region, and good distinguishability therebetween.

Figure 6B:
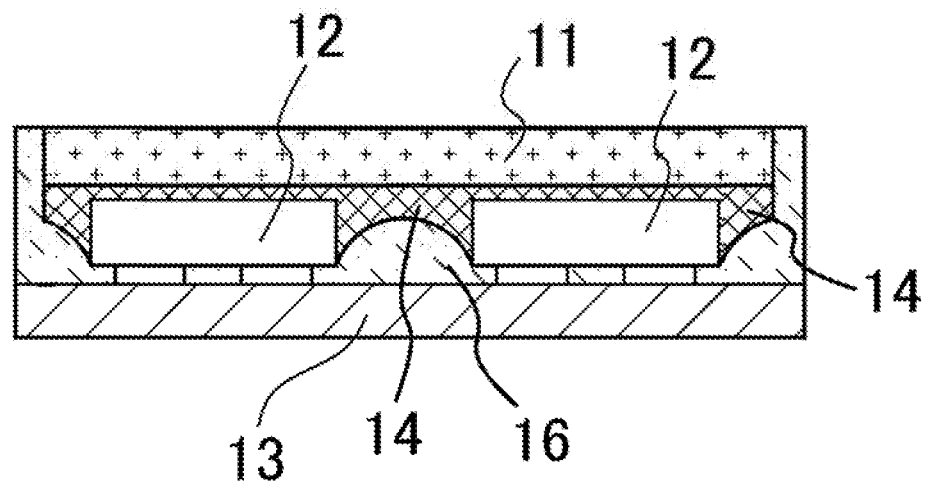
FIG. 6B is a schematic sectional diagram showing another modification of the first embodiment of a method of manufacturing a light emitting device.

The groove 15 may be formed only between light emitting elements 12 to be cut. When the light-reflective member 16 is formed in the groove 15, and cutting is performed between light emitting elements 12 where the groove 15 is formed, it is possible to obtain a light emitting device, in which a plurality of light emitting elements 12 are included and bonding members and light-transmissive members are connected between light emitting elements as shown in FIG. 6B.

Bonding members 14 that bond light emitting elements 12 may be connected, or may be separated from one another. Preferably, the bonding member 14 is situated so as to connect light emitting elements 12 as shown in FIG. 6B. This structure allows light from the light emitting element 12 to be also guided to the light-transmissive member through the bonding member from a gap between light emitting elements 12, and therefore luminance unevenness of the light emitting device can be reduced.

Second Embodiment

A method of manufacturing a light emitting device according to this embodiment includes providing a light-transmissive member 21 having a layered structure instead of providing the light-transmissive member 11 having a single-layer structure.

For example, the light-transmissive member 21 may be a layered body structured by a fluorescent material-containing layer 21b containing a fluorescent material and a fluorescent material-free layer 21a which does not contain a fluorescent material. Alternatively, the light-transmissive member 21 may be a layered body in which three or more layers thereof are alternately stacked. The light-transmissive member 21 may have a structure in which a plurality of fluorescent material-containing layers each containing different kinds of fluorescent materials is stacked, or a structure in which a fluorescent material-free layer is further stacked on the above-mentioned fluorescent material-containing layers. For example, a layer containing a fluorescent material that emits green light and a layer containing a fluorescent material that emits red light may be formed separately, and joined together to obtain a light-transmissive member having two-layer structure. The fluorescent material-containing layer 21b or the fluorescent material-free layer 21a may be formed, followed by forming the fluorescent material-containing layer 21b and/or the fluorescent material-free layer 21a on the upper surface thereof by a spraying method or the like to obtain a light-transmissive member having a structure with two or more layers.

Figure 3:
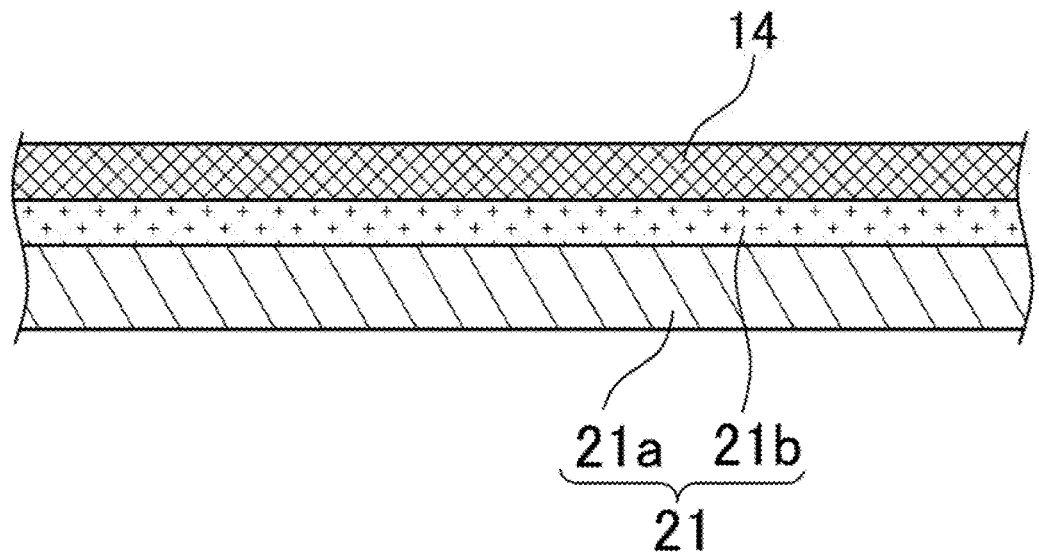
FIG. 3 is a schematic sectional diagram showing a process of a second embodiment of a method of manufacturing a light emitting device.

With the light-transmissive member 21 having such a two-layer structure, when the fluorescent material-containing layer 21b contains a fluorescent vulnerable to moisture and/or an external environment, e.g. a KSF fluorescent material, it is preferable to dispose the fluorescent material-free layer 21a on a side far from the primary light emission surface of the light emitting element. Thus, in providing the light-transmissive member, the light-transmissive member 11 is preferably disposed on one surface of the fluorescent material-containing layer 21b of the light-transmissive member 21 as shown in FIG. 3.

Accordingly, a fluorescent material vulnerable to moisture etc. is protected by the fluorescent material-free layer 21a, in other words, the fluorescent material is less likely to be exposed to an external environment, so that degradation of the fluorescent material can be mitigated.

When the light-transmissive member contains a fluorescent material-containing layer and a fluorescent material-free layer 11a, for example, the thickness of the fluorescent material-containing layer is in a range of from 10 μm to 250 μm, preferably in a range of from 30 μm to 200 μm.

Except for the above, the manufacturing method is essentially the same as or a similar to in the first embodiment, and has the same as or a similar effect as in the first embodiment 1.

When the light-transmissive member 21 is used, a bonding member 14 may be disposed on a primary light emission surface 12a of a light emitting element 12 beforehand as described later, instead of disposing the bonding member 14 on the light-transmissive member 21.

Third Embodiment

A method of manufacturing a light emitting device according to this embodiment includes disposing a bonding member 14 on a primary light emission surface 12a of a light emitting element 12 beforehand as shown in FIG. 4, instead of disposing a bonding member on the upper surfaces of light-transmissive members 11 and 21 beforehand.

Disposition of the bonding member 14 on the primary light emission surface 12a of the light emitting element 12 is preferably performed after boding the light emitting element 12 to the upper surface of a base member 13.

Figure 4A:
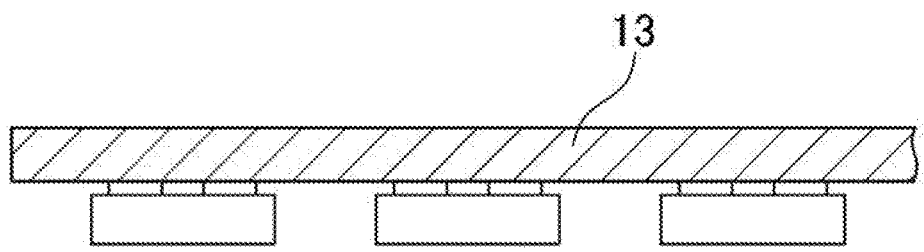
FIG. 4A is a schematic sectional diagram showing a process of a third embodiment of a method of manufacturing a light emitting device.
Figure 4B:
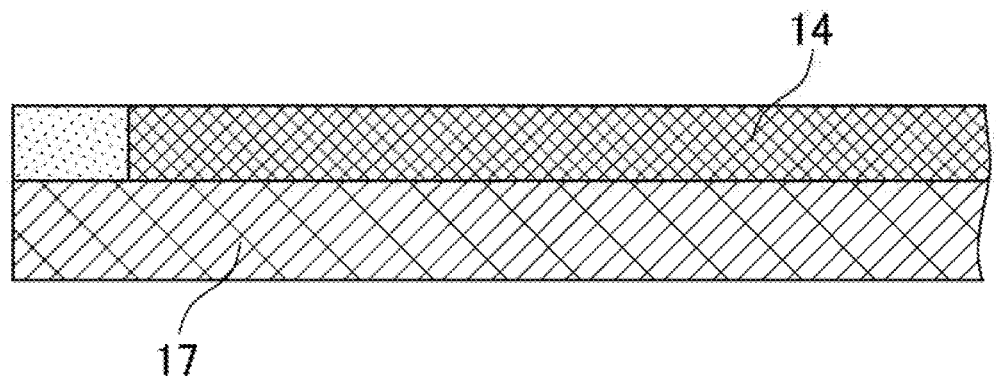
FIG. 4B is a schematic sectional diagram showing a process of the third embodiment of a method of manufacturing a light emitting device.
Figure 4C:
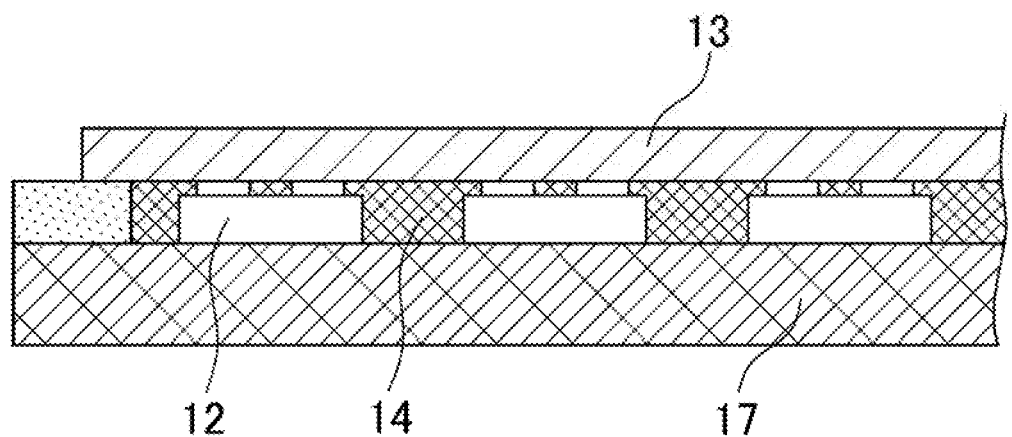
FIG. 4C is a schematic sectional diagram showing a process of the third embodiment of a method of manufacturing a light emitting device.
Figure 4D:
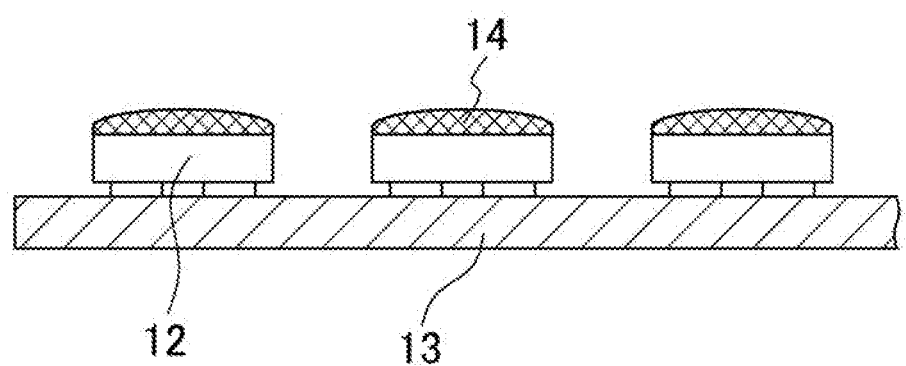
FIG. 4D is a schematic sectional diagram showing a process of the third embodiment of a method of manufacturing a light emitting device.

For example, manufacturing the light emitting device according to this embodiment can be accomplished by a method as follows. A plurality of light emitting elements 12 is bonded to the base member 13 as shown in FIG. 4A. The bonding member 14 is disposed on a flat base 17 as shown in FIG. 4B. The light emitting elements 12 bonded to the base member 13 is brought into contact with the bonding member 14 disposed on the flat base 17 as shown in FIG. 4C. Then the bonding member can be disposed on the primary light emission surfaces 12a of the light emitting elements 12 as shown in FIG. 4D.

Accordingly, the bonding member 14 can be collectively and uniformly disposed on the light emitting elements 12 in an appropriate amount. At the time of bringing the light emitting elements 12 into contact with the bonding member 14, heat may be applied by the bonding member 14 that is used. Alternatively, the bonding member 14 may be disposed on the primary light emission surfaces 12a of light emitting elements 12 using a technique such as pin transfer, dispensing or printing.

Except for the above, the manufacturing method is essentially the same or a similar as in the first embodiment, and has the same or a similar effect as in the first embodiment 1.

Fourth Embodiment

Figure 5A:
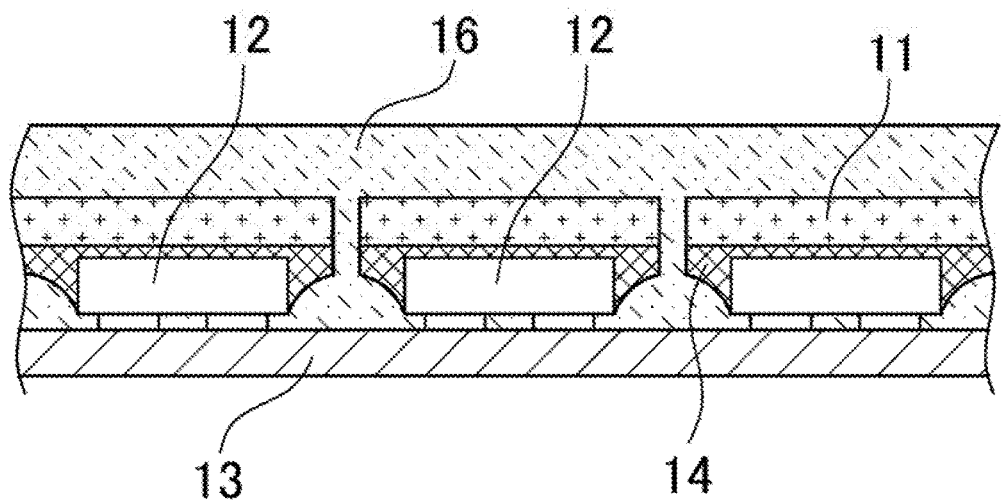
FIG. 5A is a schematic sectional diagram showing a process of a fourth embodiment of a method of manufacturing a light emitting device.

A method of manufacturing a light emitting device according to this embodiment includes forming a light-reflective member 16 such that a plurality of light emitting elements 12 and a light-transmissive member 11 are wholly embedded as shown in FIG. 5A, in other words, the upper surface of the light-transmissive member 11 is covered.

Figure 5B:
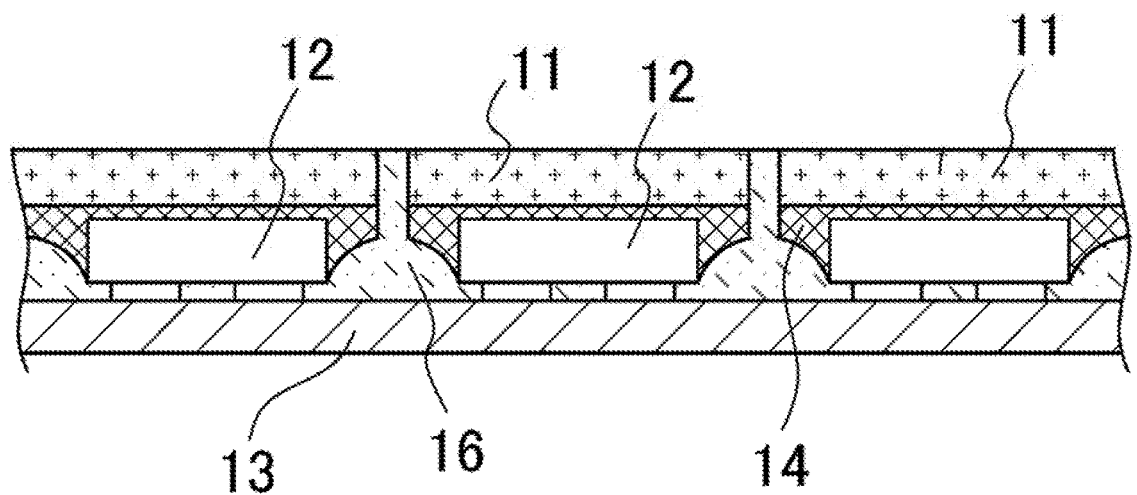
FIG. 5B is a schematic sectional diagram showing a process of the fourth embodiment of a method of manufacturing a light emitting device.

Thereafter, a light-reflective member 16 disposed on the upper surface of the light-transmissive member 11 may be removed to expose the light-transmissive member 11 so that the light-reflective member 16 is flush with the upper surface of the light-transmissive member 11 as shown in FIG. 5B.

The light-reflective member 16 can be removed by polishing or grinding, cutting, polishing, CMP, ultrasonic processing, laser processing or the like.

Here, in particular, the light-transmissive member 21 having a two-layer structure with a fluorescent material-containing layer 21b and a fluorescent material-free layer 21a can be used, and the fluorescent material-free layer 21a can be disposed on a side far from the primary light emission surface of the light emitting element. In this case, the amount of a fluorescent material in the light-transmissive member 21 is less likely to be changed even if a part of the light-transmissive member 21 is removed together with the light-reflective member 16. Thus, stable light conversion can be attained.

Except for the above, the manufacturing method is essentially the same as or a similar to that in the first embodiment, and has the same or a similar effect as in the first embodiment 1.

What is claimed is:
1. A method of manufacturing a light emitting device, the method comprising:

providing a light-transmissive member having a plate-like shape;

providing a plurality of light emitting elements each having a primary light emission surface and an electrode formation surface on a side opposite to the primary light emission surface;

bonding the light emitting elements to an upper surface of a base member such that the electrode formation surface of each of the light emitting elements faces the upper surface of the base member;

disposing a substantially flat layer of a light-transmissive bonding member on an upper surface of the light-transmissive member, the substantially flat layer of the light-transmissive bonding member having a substantially constant thickness as measured along a direction normal to the upper surface of the light-transmissive member;

disposing the light emitting elements on the upper surface of the light-transmissive member such that the primary light emission surface of each of the light emitting elements faces the upper surface of the light-transmissive member via the bonding member interposed therebetween;

disposing a part of the bonding member on a lateral surface of each of the light emitting elements so that the part of the bonding member continuously extends between adjacent ones of the light emitting elements, and so that an outer surface of the part of the bonding member forms a recess inwardly curved toward a light-transmissive member side between the adjacent ones of the light emitting elements;

removing a part of the light-transmissive member to form a groove between the light emitting elements;

forming a light-reflective member at least in the groove; and cutting the light-reflective member.

2. The method of manufacturing a light emitting device according to claim 1, wherein
the providing of the light-transmissive member includes providing a layered body of a fluorescent material-containing layer and a fluorescent material-free layer as the light-transmissive member, and
the disposing of the light emitting elements on the upper surface of the light-transmissive member includes disposing the light emitting elements on the fluorescent material-containing layer such that the primary light emission surface of each of the light emitting elements faces the fluorescent material-containing layer.

3. The method of manufacturing a light emitting device according to claim 1, wherein
the disposing of the part of the bonding member on the lateral surface of each of the light emitting elements includes disposing the part of the bonding member to contact both of the lateral surface of one of the light emitting elements and the lateral surface of an adjacent one of the light emitting elements facing each other.

4. The method of manufacturing a light emitting device according to claim 1, wherein
the removing of the part of the light-transmissive member to form the groove between the light emitting elements includes removing a part of the bonding member.

5. The method of manufacturing a light emitting device according to claim 1, wherein
the forming of the light-reflective member includes:
covering a surface of the light-transmissive member on a side opposite to the upper surface; and
exposing the light-transmissive member by removing the light-reflective member disposed on the upper surface of the light-transmissive member.

6. The method of manufacturing a light emitting device according to claim 1, further comprising
cutting the base member after the forming of the light-reflective member or after the cutting of the light-reflective member.

7. The method of manufacturing a light emitting device according to claim 1, wherein
the removing of the part of the light-transmissive member includes adjusting a width of the groove so that a portion of the light-reflective member covering the lateral surface of each of the light emitting elements has a prescribed thickness.

8. The method of manufacturing a light emitting device according to claim 1, wherein
the bonding of the light emitting elements to the upper surface of the base member includes arranging the light emitting elements at an interval of 10 µm to 1000 µm.

9. The method of manufacturing a light emitting device according to claim 1, wherein
the bonding member contains an additive that scatters light.

10. The method of manufacturing a light emitting device according to claim 1, wherein
the disposing of the part of the bonding member on the lateral surface of each of the light emitting elements includes disposing the part of the bonding member so that the bonding member covers at least 50% of the lateral surface of each of the light emitting elements.

11. The method of manufacturing a light emitting device according to claim 1, wherein
the removing of the part of the light-transmissive member includes adjusting a depth of the groove to be in a range of from 150 µm to 210 µm.

12. The method of manufacturing a light emitting device according to claim 1, wherein
the disposing of the part of the bonding member on the lateral surface of each of the light emitting elements includes disposing of the part of the bonding member so that the outer surface of the part of the bonding member is inclined so as to extend away from the lateral surface of each of the light emitting elements.

13. The method of manufacturing a light emitting device according to claim 1, wherein
the forming of the light-reflective member includes forming the light-reflective member so that a surface of the light-reflective member is flush with a surface of the light transmissive member.

14. The method of manufacturing a light emitting device according to claim 1, wherein
the removing of the part of the light-transmissive member includes forming the groove between every two or more light emitting elements.

15. The method of manufacturing a light emitting device according to claim 2, wherein
the providing of the light-transmissive member includes providing the fluorescent material-containing layer on a side closer to the primary light emission surface of each of the light emitting elements, and providing the fluorescent material-free layer on a side away from the primary light emission surface of each of the light emitting elements.

16. The method of manufacturing a light emitting device according to claim 1, further comprising bringing the light emitting elements into contact with the bonding member and applying heat while the light emitting elements are in contact with the bonding member.

17. The method of manufacturing a light emitting device according to claim 1, wherein
the disposing of the light emitting elements on the upper surface of the light-transmissive member includes applying a pressure so that the primary light emission surface of each of the light emitting elements get closer to the upper surface of the light-transmissive member, and curing the bonding member by heat or light after the applying of the pressure.

18. The method of manufacturing a light emitting device according to claim 10, wherein
the disposing of the part of the bonding member on the lateral surface of each of the light emitting elements includes disposing the part of the bonding member so that the part of the bonding member covers an entirety of the lateral surface of each of the light emitting elements.

19. The method of manufacturing a light emitting device according to claim 1, wherein
the removing of the part of the light-transmissive member includes removing the part of the light-transmissive member so that a width of the light-transmissive member from the lateral surface of a corresponding one of the light emitting elements as measured along a direction parallel to the upper surface of the light-transmissive member is equal to or more than 100 μm and less than 500 μm.

\* \* \* \* \*